United States Patent
Yun et al.

(10) Patent No.: US 10,818,367 B2
(45) Date of Patent: Oct. 27, 2020

(54) CONTROLLER AND METHOD OF OPERATING THE SAME

(71) Applicant: SAMSUNG ELECTRONICS CO., LTD., Suwon-si, Gyeonggi-Do (KR)

(72) Inventors: Eun-Jin Yun, Seoul (KR); Sung June Youn, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/364,230

(22) Filed: Mar. 26, 2019

(65) Prior Publication Data

US 2020/0027512 A1 Jan. 23, 2020

(30) Foreign Application Priority Data

Jul. 23, 2018 (KR) .................. 10-2018-0085351

(51) Int. Cl.
| | | |
|---|---|---|
| *G11C 16/04* | (2006.01) | |
| *G11C 16/10* | (2006.01) | |
| *G11C 16/14* | (2006.01) | |
| *G11C 16/34* | (2006.01) | |
| G11C 16/16 | (2006.01) | |
| G11C 11/56 | (2006.01) | |

(52) U.S. Cl.
CPC ...... *G11C 16/3431* (2013.01); *G11C 16/0483* (2013.01); *G11C 16/107* (2013.01); *G11C 16/14* (2013.01); *G11C 11/5635* (2013.01); *G11C 16/16* (2013.01); *G11C 2216/14* (2013.01)

(58) Field of Classification Search
CPC ............ G11C 16/3431; G11C 16/0483; G11C 16/107; G11C 16/14; G11C 2216/14
USPC .................................................... 365/185.12
See application file for complete search history.

(56) References Cited

U.S. PATENT DOCUMENTS

| | | | |
|---|---|---|---|
| 7,085,161 B2 * | 8/2006 | Chen ................... | G06F 11/1068 |
| | | | 365/185.02 |
| 7,679,133 B2 | 3/2010 | Son et al. | |
| 8,130,554 B1 | 3/2012 | Linnell | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,070,460 B2 | 6/2015 | Yano | |

(Continued)

FOREIGN PATENT DOCUMENTS

| | | |
|---|---|---|
| KR | 100672172 B1 | 1/2007 |
| KR | 1020140096796 A | 8/2014 |

(Continued)

*Primary Examiner* — Ly D Pham
(74) *Attorney, Agent, or Firm* — Voletine, Whitt & Francos, PLLC

(57) ABSTRACT

A method of operating a controller that controls a non-volatile memory device having a first memory block and a second memory block. The controller may detect invalid data of the first memory block, determine whether the detected invalid data is less than a reference value, and execute a secure erase operation of changing a voltage distribution of the detected invalid data based on a result of the determination. According to this method, it may be possible to enhance security of data stored in the non-volatile memory device, to prevent a physical erase operation from being excessively performed, and to increase the life span of the non-volatile memory device.

20 Claims, 14 Drawing Sheets

(56) References Cited

U.S. PATENT DOCUMENTS

| | | | |
|---|---|---|---|
| 9,098,401 B2 | 8/2015 | Kasorla et al. | |
| 9,792,068 B2* | 10/2017 | Nagata | G06F 3/064 |
| 2007/0239928 A1* | 10/2007 | Gera | G06F 16/1847 |
| | | | 711/103 |
| 2010/0017555 A1* | 1/2010 | Chang | G06F 12/0246 |
| | | | 711/103 |
| 2010/0217923 A1* | 8/2010 | Mitsumasu | G06F 12/0246 |
| | | | 711/103 |
| 2011/0161571 A1 | 6/2011 | Kim et al. | |
| 2013/0073821 A1* | 3/2013 | Flynn | G06F 3/061 |
| | | | 711/162 |
| 2014/0006685 A1* | 1/2014 | Peterson | G06F 12/0238 |
| | | | 711/102 |
| 2014/0211565 A1 | 7/2014 | Song et al. | |
| 2016/0203053 A1* | 7/2016 | Talagala | H04L 67/1097 |
| | | | 714/6.12 |
| 2016/0267996 A1* | 9/2016 | Bushnaq | G11C 16/16 |
| 2016/0371026 A1 | 12/2016 | Shim et al. | |
| 2017/0177235 A1* | 6/2017 | Nishikubo | G06F 3/0659 |
| 2018/0040368 A1 | 2/2018 | Shim et al. | |

FOREIGN PATENT DOCUMENTS

| | | |
|---|---|---|
| KR | 101463967 B1 | 11/2014 |
| KR | 101633018 B1 | 6/2016 |
| KR | 20160150501 A | 12/2016 |
| KR | 1020160150553 A | 12/2016 |
| KR | 101818046 B1 | 1/2018 |

* cited by examiner

CONTROLLER AND METHOD OF OPERATING THE SAME

CROSS-REFERENCE TO RELATED APPLICATIONS

This U.S. non-provisional patent application claims priority under 35 U.S.C. § 119 to Korean Patent Application No. 10-2018-0085351, filed on Jul. 23, 2018, in the Korean Intellectual Property Office, the entire contents of which are hereby incorporated by reference.

BACKGROUND OF THE INVENTION

The present disclosure relates to a storage device, and in particular, to a controller of a storage device with improved security.

Semiconductor memory devices are classified into volatile memory devices (e.g., a static random access memory (SRAM), a dynamic RAM (DRAM), and a synchronous DRAM (SDRAM)), which lose data stored therein at power-off, and non-volatile memory devices (e.g., a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM)), which retain data stored therein even at power-off.

In particular, for a non-volatile storage device such as the flash memory device, an overwrite is not allowed and an erase operation is executed for each memory block. To improve security of a storage device, it is desirable that data is erased through a physical erase operation, but frequent physical erase operations cause a reduction in life span of the storage device. Thus, a method capable of improving the security of the storage device and preventing the reduction of life span caused by the frequent physical erase operations is emerging as a major issue.

SUMMARY

Example embodiments of the present disclosure provide a storage device with improved security and a method of improving security of a storage device.

According to some embodiments of the disclosure, a method of operating a controller controlling a non-volatile memory device including a first memory block and a second memory block may include detecting invalid data of the first memory block, determining whether the detected invalid data is less than a reference value, and executing a secure erase operation to change a voltage distribution of the detected invalid data, based on a result of the determination.

According to some embodiments of the disclosure, a controller may be configured to control a non-volatile memory device including a first memory block and a second memory block. The controller may include an invalid block manager, which is configured to detect invalid data of the first memory block and to execute a secure erase operation of changing a voltage distribution of the detected invalid data. The invalid block manager may be further configured to reprogram a first program state of the detected invalid data to an intermediate program state between second and third program states adjacent to each other.

According to some embodiments of the disclosure, a method of operating a controller controlling a non-volatile memory device including a first memory block and a second memory block may include detecting valid data of a first page corresponding to a target logical address, assigning an available second page, based on a result of the detection, executing a secure erase operation of changing a voltage distribution of the valid data stored in the first page, and writing data, which corresponds to the valid data and is externally received, in the second page.

According to some embodiments of the disclosure, a method executed by a nonvolatile memory device includes identifying a page of invalid data within a memory block of the nonvolatile memory device and programming, in response to identifying the page, a memory cell within the page from an initial program state to a modified program state. Neither the initial program state nor the modified program state is an erase state.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the disclosures will now be described more fully with reference to the accompanying drawings, in which example embodiments are shown.

Components described in the detailed description with reference to terms "part", "unit", "module", etc. and function blocks illustrated in drawings may be implemented with software, hardware, or a combination thereof. In an embodiment, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
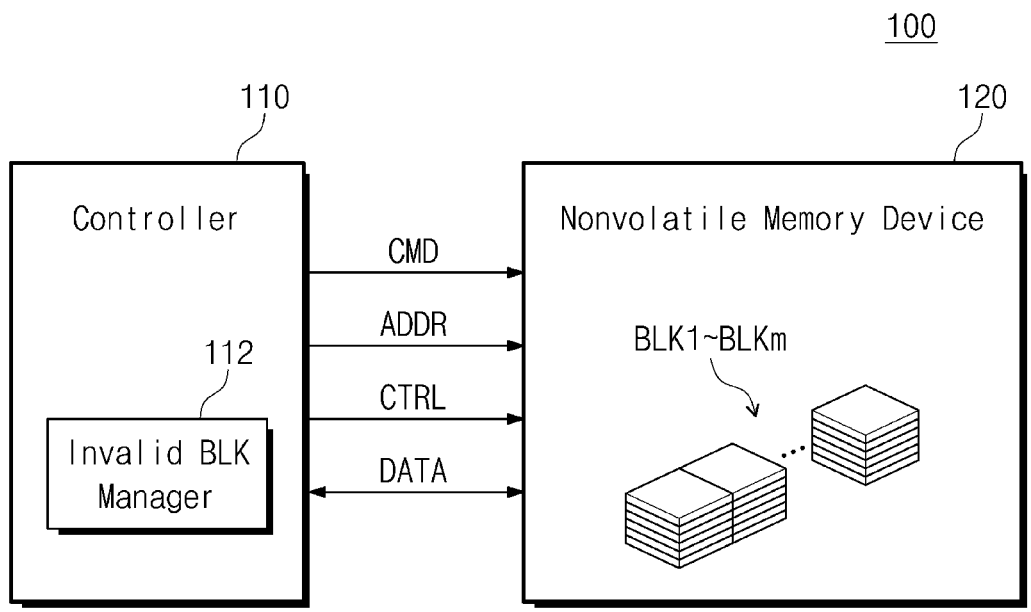
FIG. 1 illustrates a configuration of a storage device according to example embodiments of the present disclosure.

FIG. 1 illustrates a configuration of a storage device 100 according to example embodiments of the present disclosure. The storage device 100 may include a controller 110 and a non-volatile memory device 120. Furthermore, although not illustrated in the drawings, the storage device 100 may further include a buffer for temporarily storing data to be read from or written in a non-volatile memory device 120.

The controller 110 may control a read operation and a write operation on the non-volatile memory device 120. For this, the controller 110 may transfer a command CMD, an address ADDR, and a control signal CTRL to the non-volatile memory device 120. The non-volatile memory device 120 may store data, DATA, or transfer data to the controller 110, in response to signals received from the controller 110.

The controller 110 may be configured to manage invalid data stored in the non-volatile memory device 120. For example, the invalid data may mean data in which a mapping relationship between a logical address and a physical address is released (i.e., no longer valid). For this, the controller 110 may include an invalid block manager 112. The invalid block manager 112 may be configured to manage a memory block, in which invalid data is stored among memory blocks BLK1-BLKm of the non-volatile memory device 120. As an example method of the invalid data management, the controller 110 may execute a secure erase operation and a secure write operation.

In example embodiments, during the execution of the secure erase operation, the invalid block manager 112 may change a voltage distribution of invalid data, which is a target of the secure erase operation. As an example, the invalid block manager 112 may reprogram the invalid data to another program state to prevent the invalid data from being leaked (e.g., inadvertently accessed or used). As another example, the invalid block manager 112 may reprogram the invalid data such that the invalid data have a voltage distribution between two adjacent program states.

In example embodiments, during the execution of the secure write operation, the invalid block manager 112 may change the voltage distribution of the invalid data. As an example, the invalid block manager 112 may reprogram the invalid data to another program state to prevent the invalid data from being leaked. As another example, the invalid block manager 112 may reprogram the invalid data such that the invalid data may have a voltage distribution between two adjacent program states.

According to the afore-described storage device, the storage device may be configured to prevent the invalid data from being wholly read, and this may make it possible to improve the security of the storage device. In addition, the invalid data stored in the non-volatile memory device 120 may be erased by the secure erase operation, not by a physical erase method, and thus, it may be possible to reduce the number of physical data erase operations. As a result, it may be possible to increase the life span of the storage device. The secure erase operation and the secure write operation will be described in more detail below.

Figure 2:
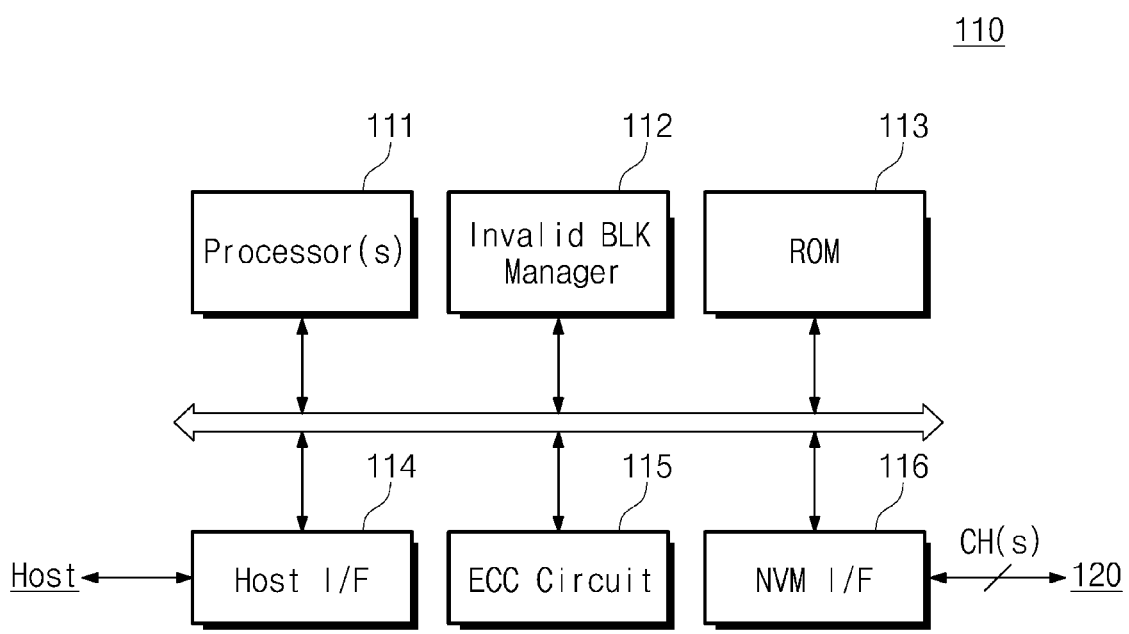
FIG. 2 illustrates an example configuration of the controller shown in FIG. 1.

FIG. 2 illustrates an example configuration of the controller shown in FIG. 1. The controller 110 may further include at least one processor 111, a ROM 113, a host interface circuit 114, an error check and correction (ECC) circuit 115, and a non-volatile memory interface circuit 116, in addition to the invalid block manager 112.

The processor 111 may control an overall operation of the controller 110. The processor 111 may drive various firmware and software needed to control the non-volatile memory device 120. For example, the processor 111 may drive a flash translation layer (FTL) for managing a mapping table, in which a relationship between logical and physical addresses of the non-volatile memory device 120 is defined.

The invalid block manager 112 may execute the secure erase operation and the secure write operation described above. As an example, the invalid block manager 112 may be implemented with an application specific integrated circuit (ASIC), a field programmable gate array (FPGA), and/or a combination thereof. As another example, the invalid block manager 112 may be included as a part of a function of a flash translation layer (FTL) to be executed by the controller 110. As other example, the invalid block manager 112 may be implemented with software or firmware to be executed by the controller 110, other than the flash translation layer.

The ROM 113 may store a boot code needed to boot the storage device 100. In addition, the ROM 113 may store separate firmware for loading firmware stored in the non-volatile memory device 120 onto a buffer memory (not shown). For example, the firmware stored in the ROM 113 may be executed upon booting the storage device 100 or may be executed externally (e.g., by a host) or by an internal request during a runtime of the storage device 100.

The host interface circuit 114 may perform communication with a host device by using a bus which has various communication protocols. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), universal flash storage (UFS), or the like.

The ECC circuit 115 may generate an error correction code for data to be stored in the non-volatile memory device 120. The ECC circuit 115 may detect and correct an error of read data, based on the error correction code read from the non-volatile memory device 120.

The non-volatile memory interface circuit 116 may perform communication with the non-volatile memory device 120 through one or more channels CH(s).

Figure 3:
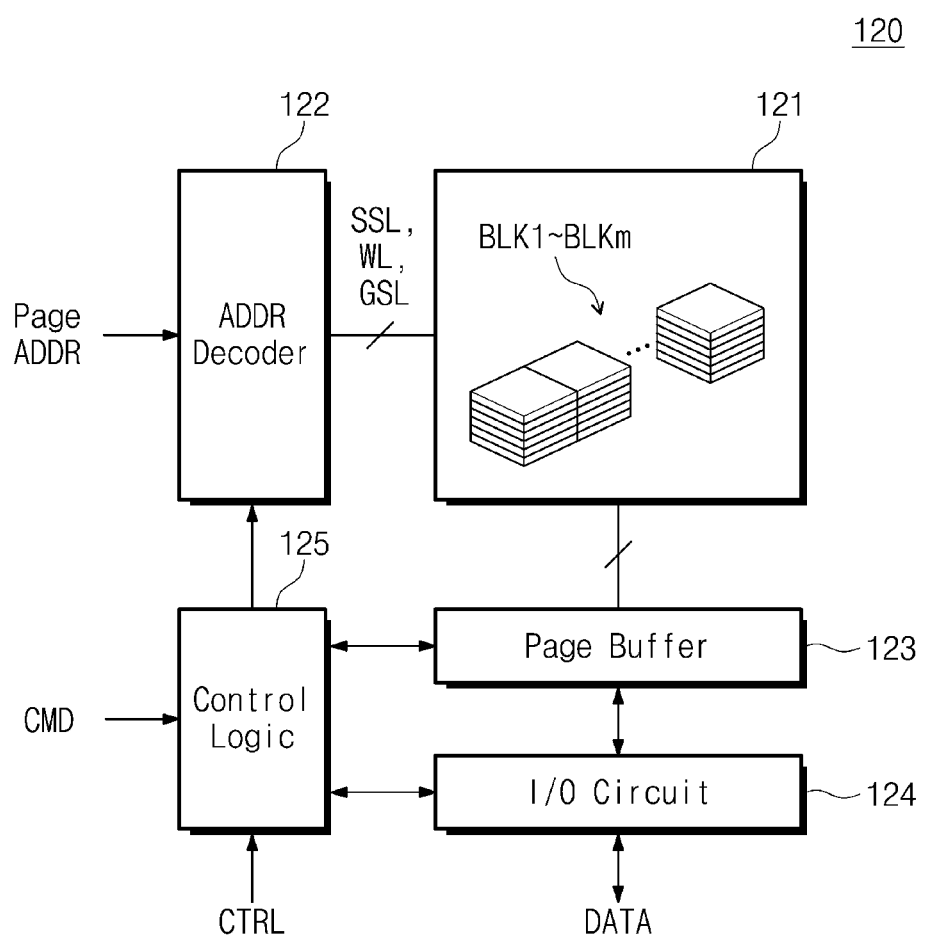
FIG. 3 illustrates an example configuration of a non-volatile memory device of FIG. 1.

FIG. 3 illustrates an example configuration of the non-volatile memory device 120 of FIG. 1. The non-volatile memory device 120 may include a memory cell array 121, an address decoder 122, a page buffer 123, an input/output circuit 124, and a control logic 125. To provide better understanding of example embodiments of the disclosure, FIG. 1 is referred to along with FIG. 3.

The memory cell array 121 may include a plurality of memory blocks BLK1~BLKm. Each of the memory blocks BLK1~BLKm may include a plurality of cell strings. Each of the cell strings may include a plurality of memory cells. The memory cells may be connected to a plurality of word lines WL. Each memory cell may be a single level cell (SLC), which is configured to store one bit, or a multi-level cell (MLC), which is configured to store at least two bits.

The address decoder 122 may be connected to the memory cell array 121 through a plurality of word lines WL, a plurality of string selection lines SSL, and one or more ground selection lines GSL. The address decoder 122 may receive a logical address (e.g., Page ADDR) from the outside and may decode the received logical address to drive the plurality of word lines WL. For example, the address ADDR may be a physical address converted from the logical address. The address converting operation may be executed by, for example, the flash translation layer (FTL) driven by the controller 110.

The page buffer 123 may be connected with the memory cell array 121 through a plurality of bit lines BL. Under control of the control logic 125, the page buffer 123 may control the bit lines BL such that data "DATA" received from the input/output circuit 124 are stored in the memory cell array 121. Under control of the control logic 125, the page buffer 123 may read data "DATA" stored in the memory cell array 121 and may provide the read data "DATA" to the input/output circuit 124. In an embodiment, the page buffer 123 may receive data "DATA" from the input/output circuit 124 in units of pages or may read data "DATA" from the memory cell array 121 in units of pages.

The input/output circuit 124 may receive the data "DATA" from an external device and may provide the received data "DATA" to the page buffer 123.

The control logic 125 may receive the command CMD and the control signal CTRL from outside and may control the address decoder 122, the page buffer 123, and the input/output circuit 124 in response to the command CMD and the control signal CTRL. For example, the control logic 125 may control other components in response to the command CMD and the control signal CTRL such that data "DATA" are stored in the memory cell array 121. Alternatively, the control logic 125 may control other components in response to the command CMD and the control signal CTRL such that data "DATA" stored in the memory cell array 121 are transmitted to the external device. The control signal CTRL may be a signal that is provided from the controller 110 to control the non-volatile memory device 120.

The control logic 125 may generate various voltages that are required for various operations of the non-volatile memory device 120. For example, the control logic 125 may generate a plurality of program voltages, a plurality of pass voltages, a plurality of selection read voltages, a plurality of non-selection read voltages, a plurality of erase voltages, a plurality of verification voltages, or the like. The control logic 125 may provide the generated voltages to the address decoder 122 or to a substrate of the memory cell array 121.

Figure 4:
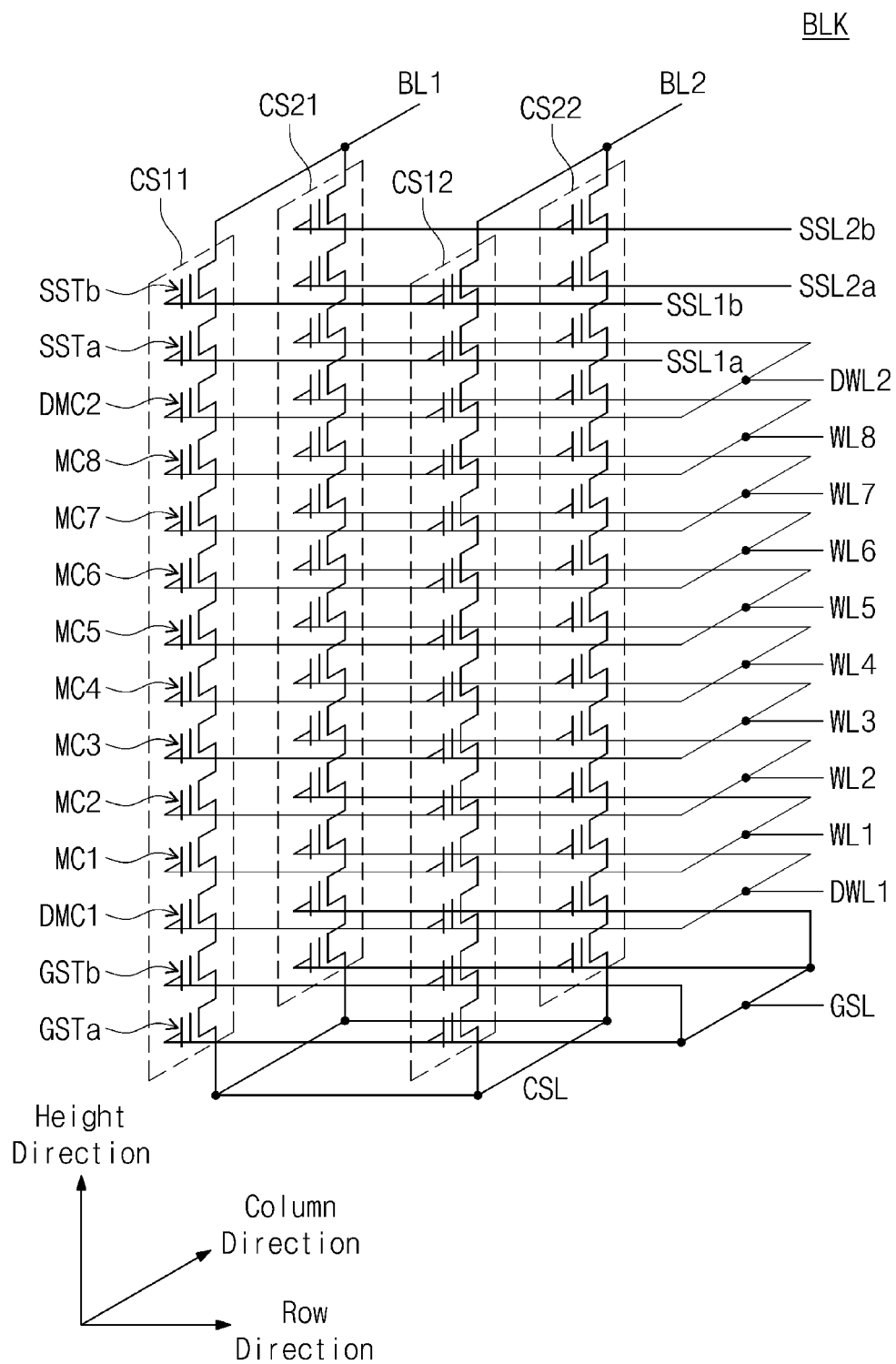
FIG. 4 is an equivalent circuit diagram of one of memory blocks included in a memory cell array of FIG. 3.

FIG. 4 is an equivalent circuit diagram of one of memory blocks BLK1~BLKm included in the memory cell array of FIG. 3. A memory block BLK may include a plurality of cell strings CS11, CS12, CS21, and CS22. The cell strings CS11, CS12, CS21, and CS22 may be arranged in a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1-MC8, ground selection transistors GSTa and GSTb, and dummy memory cells DMC1 and DMC2. For example, each of the cell transistors included in the cell strings CS11, CS12, CS21, and CS22 may be a charge trap flash (CTF) memory cell.

The memory cells MC1-MC8 may be connected in series and may be stacked in a height direction, which is perpendicular to a plane defined by the row and column directions. The string selection transistors SSTa and SSTb may be connected in series and may be provided between the memory cells MC1-MC8 and the bit line BL (e.g., BL1, BL2). The ground selection transistors GSTa and GSTb may be connected in series and may be provided between the memory cells MC1-MC8 and a common source line CSL.

As an example, a first dummy memory cell DMC1 may be provided between the memory cells MC1-MC8 and the ground selection transistors GSTa and GSTb. As an example, a second dummy memory cell DMC2 may be provided between the memory cells MC1-MC8 and the string selection transistors SSTa and SSTb.

The ground selection transistors GSTa and GSTb of the cell strings CS11, CS12, CS21, and CS22 may be connected in common to the ground selection line GSL. As an example, ground selection transistors in the same row may be connected to the same ground selection line, and ground selection transistors in different rows may be connected to different ground selection lines. For example, the first ground selection transistors GSTa of the cell strings CS11 and CS12 in a first row may be connected to a first ground selection line, and the first ground selection transistors GSTa of the cell strings CS21 and CS22 in a second row may be connected to a second ground selection line.

As an example, unlike an illustrated drawing, ground selection transistors provided at the same height from a substrate (not shown) may be connected to the same ground selection line, and ground selection transistors provided at different heights may be connected to different ground selection lines. For example, the first ground selection transistors GSTa and the second ground selection transistors GSTb of the cell strings CS11, CS12, CS21, and CS22 may be connected to a first ground selection line and a second ground selection line, respectively.

Memory cells, which are provided at the same height from the substrate or the ground selection transistors GSTa and GSTb, may be connected in common to the same word line, and memory cells at different heights may be connected to different word lines. For example, the first to eighth memory cells MC1 to MC8 of the cell strings CS11, CS12, CS21, and CS22 may be connected in common to first to eighth word lines WL1 to WL8, respectively.

The first string selection transistors SSTa at the same height and in the same row may be connected to the same string selection line, and the first string selection transistors SSTa at the same height and in different rows may be connected to different string selection lines. For example, the first string selection transistors SSTa of the cell strings CS11 and CS12 in a first row may be connected in common to a string selection line SSL1a, and the first string selection transistors SSTa of the cell strings CS21 and CS22 in a second row may be connected in common to a string selection line SSL2a.

Similarly, the second string selection transistors SSTb at the same height and in the same row may be connected to the same string selection line, and the second string selection transistors SSTb at the same height and in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

As an example, dummy memory cells at the same height may be connected to the same dummy word line, and dummy memory cells at different heights may be connected to different dummy word lines. For example, the first dummy memory cells DMC1 may be connected to a first dummy word line DWL1, and the second dummy memory cells DMC2 may be connected to a second dummy word line DWL2.

In the memory block BLK, read and write operations may be performed for each row. For example, one row of the memory block BLK may be selected by the string selection lines SSL1a, SSL1b, SSL2a, and SSL2b.

For example, the cell strings CS11 and CS12 in the first row are respectively connected to bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row are respectively connected to the bit lines BL1 and BL2 when the turn-on voltage is supplied to the string selection lines SSL2a and SSL2b and the turn-off voltage is supplied to the string selection lines SSL1a and SSL1b. As a word line is driven, memory cells, which are arranged at the same height, from among memory cells of cell strings connected to the driven word line may be selected. Read and write operations may be performed on the selected memory cells. The selected memory cells may constitute a physical page unit.

In the memory block BLK, an erase operation may be performed for each memory block or for each sub-block. When an erase operation is performed for each memory block, all memory cells MC in the memory block BLK may be simultaneously erased in response to one erase request. When the erase operation is performed for each sub-block, some of memory cells MC in the memory block BLK may be simultaneously erased in response to one erase request, and the remaining memory cells thereof may be erase-inhibited. A low voltage (e.g., a ground voltage) may be supplied to a word line connected to memory cells to be erased, and a word line connected to erase-inhibited memory cells may be floated.

FIG. 4 illustrates just an example of the memory block BLK, and the number of the cell strings and the numbers of rows and columns of the cell strings may be changed. In addition, the numbers of the cell transistors (e.g., GST, MC, DMC, SST, and so forth) of the memory block BLK may be changed, and a height of the memory block BLK may be changed according to the numbers of the cell transistors. In addition, the numbers of the lines (e.g., GSL, WL, DWL, SSL, and so forth) connected to the cell transistors may be changed according to the numbers of the cell transistors.

Figure 5:
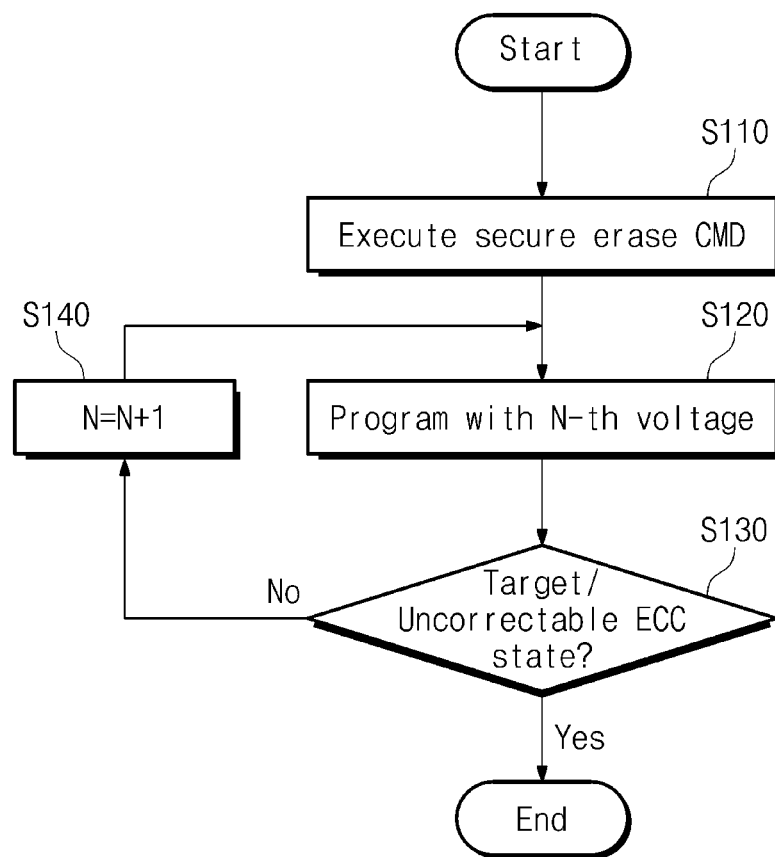
FIG. 5 is a flow chart illustrating a method of operating a controller, according to example embodiments of the present disclosure.
Figure 6:
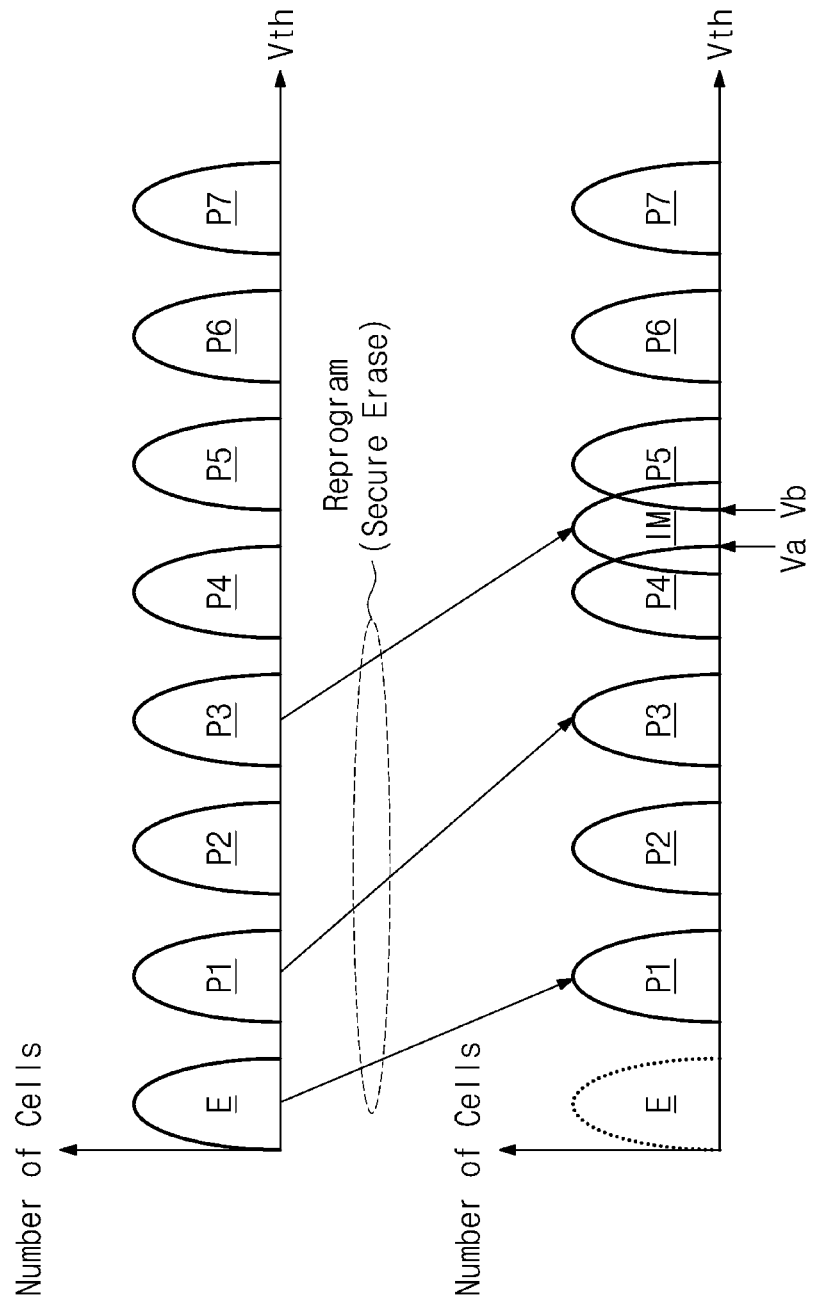
FIGS. 6 and 7 are voltage distribution diagrams for illustrating a secure erase operation of the present disclosure.
Figure 7:
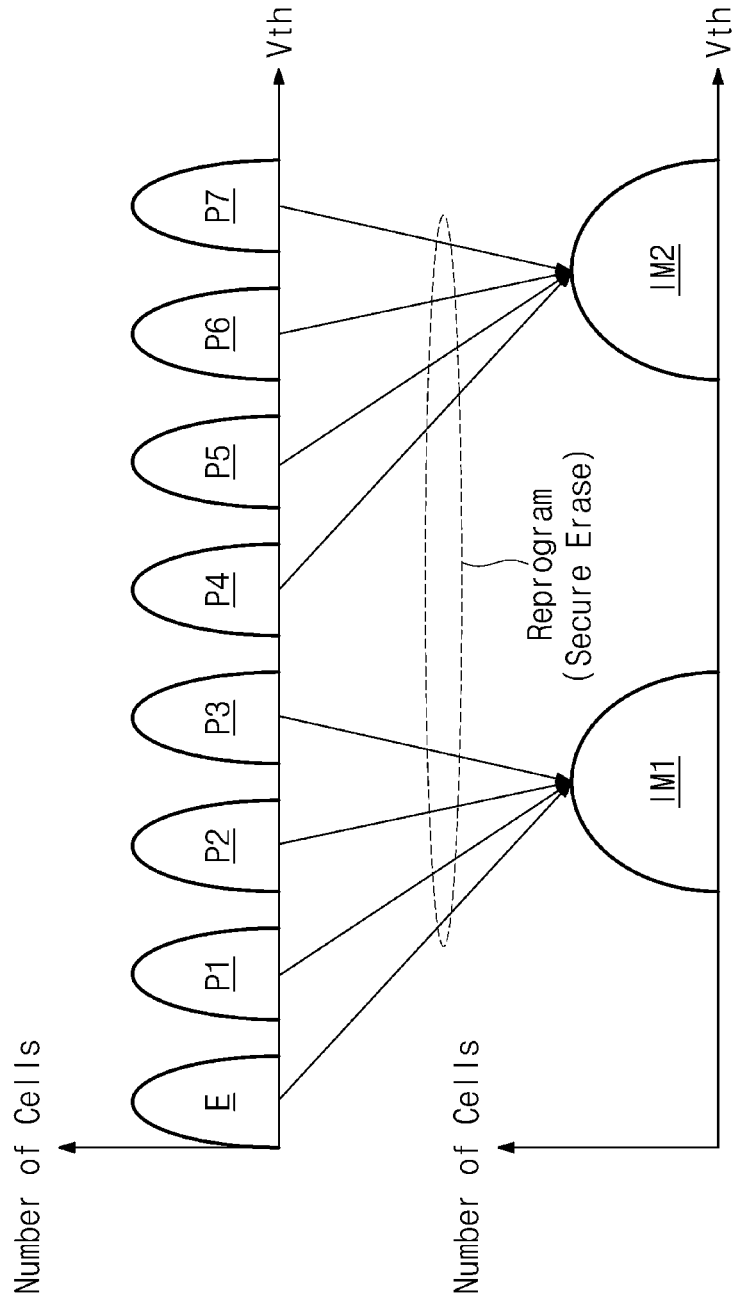

FIG. 5 is a flow chart illustrating a method of operating a controller, according to example embodiments of the present disclosure. FIGS. 6 and 7 are voltage distribution diagrams for illustrating a secure erase operation of the present disclosure. To provide better understanding of example embodiments of the disclosure, FIGS. 1, 6, and 7 are referred to along with FIG. 5. In the graphs of FIGS. 6 and 7, the horizontal axis illustrates threshold voltage and the vertical axis illustrates the number of memory cells.

In operation S110, a secure erase command may be executed. For example, in the case where invalid data is produced by a garbage collection operation, a read reclaim operation, or the like, the secure erase command may be executed to manage a memory block including the invalid data.

In example embodiments, in the case where the garbage collection operation, the read reclaim operation, or the like which result in producing the invalid data is executed, a secure erase command for the secure erase operation may be generated. In other example embodiments, in the case where the garbage collection operation, the read reclaim operation, or the like which result in producing the invalid data is executed, the secure erase operation may be executed without generation of a separate command for the secure erase operation. In this case, a tag associated with the execution of the secure erase operation may be added in a control signal associated with the garbage collection operation, the read reclaim operation, or the like or a field value associated with the execution of the secure erase operation may be generated.

In operation S120, the invalid data may be reprogrammed. For example, the invalid data may be reprogrammed to have a target program state. Here, the target program state may mean a predetermined or arbitrary program state of program states higher than a program state of the invalid data. For example, as shown in FIG. 6, the invalid data with an erase state E may be reprogrammed to have a first program state P1 or the invalid data with the first program state P1 may be reprogrammed to have a third program state P3. However, this is just an example of the reprogramming of the invalid data, but the disclosure is not limited to this example.

In example embodiments, the invalid data may be reprogrammed such that it is positioned at a voltage distribution between two adjacent program states. The two adjacent program states may be program states that are higher than a program state of the invalid data. Referring to FIG. 6, the invalid data with the third program state P3 may be reprogrammed to have an intermediate program state IM between a fourth program state P4 and a fifth program state P5.

In this case, among the memory cells in the intermediate program state IM, a memory cell, whose threshold voltage is lower than an upper limit Va of the fourth program state P4, may be read as data in the fourth program state P4. Among memory cells in the intermediate program state IM, a memory cell, whose threshold voltage is higher than a lower limit Vb of the fifth program state P5, may be read as data in the fifth program state P5. Among the memory cells in the intermediate program state IM, a memory cell having a threshold voltage between the limits Va and Vb may store data in an unreadable or uncorrectable ECC state.

Although a voltage distribution of the intermediate program state IM is illustrated to be partially overlapped with voltage distributions of the fourth and fifth program states P4 and P5, the voltage distribution of the intermediate program state IM may not be overlapped with the voltage distributions of the fourth and fifth program states P4 and P5. That is, the intermediate program state IM may have a threshold voltage distribution between an upper limit and a lower limit (i.e., from Va to Vb) of two adjacent voltage distributions (e.g., P4 and P5).

In example embodiments, data distributed in several program states may be reprogrammed to have a single intermediate program state. For example, as shown in FIG. 7, data distributed in an erase state E and first to third program states P1-P3 may be reprogrammed to have a first intermediate program state IM1. Similarly, data distributed in fourth to seventh program states P4-P7 may be reprogrammed to have a second intermediate program state IM2. Here, a distribution range of each of the first and second intermediate program states IM1 and IM2 may be wider than a distribution range of each of the program states (i.e., one of the first to seventh program states P1-P7).

However, the reprogramming executed in the secure erase operation of the present disclosure is not limited to those illustrated in FIGS. 6 and 7. The reprogramming may be executed through various combinations of the reprograms illustrated in FIGS. 6 and 7.

In example embodiments, the secure erase operation of programming the invalid data may be executed using a method applying a program voltage according to an incremental step pulse programming (ISPP) manner. Here, an initial value of a variable N may be one, and in this case, invalid data may be programmed by an initial pulse having the lowermost voltage level.

In operation S130, it may be determined whether the programmed invalid data is distributed in a target program state or in an uncorrectable ECC state. For example, this operation may be executed by applying a verification voltage to a memory cell, in which invalid data is stored. As an example, the verification voltage may be a voltage for determining whether the programmed invalid data is in a target program state. As another example, the verification voltage may be a voltage for determining whether the programmed invalid data is distributed in voltage distributions between two adjacent program states.

If the programmed invalid data is determined to be distributed in the target program state or the uncorrectable ECC state (i.e., Yes in S130), the procedure may be terminated. Otherwise (i.e., No in S130), a program pulse with a next voltage level may be prepared (in S140). Thereafter, in operation S120, the invalid data may be programmed using the program pulse having the next voltage level.

Figure 8:
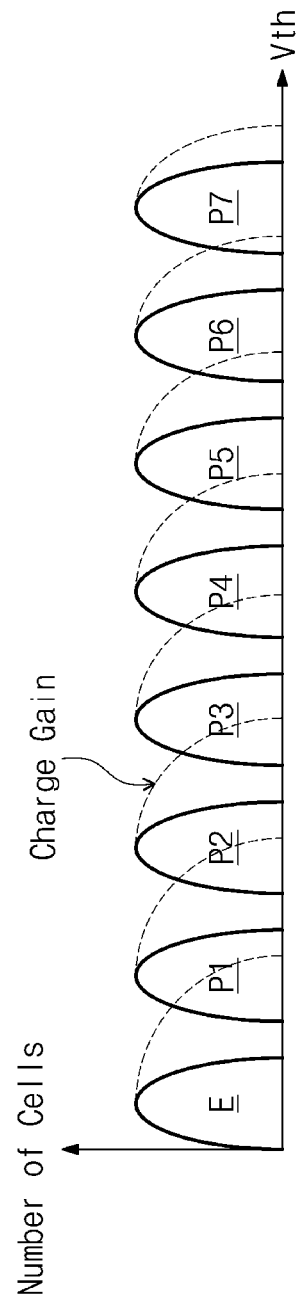
FIG. 8 is a threshold voltage distribution diagram for illustrating an interference phenomenon, which may occur in a secure erase operation.
Figure 9:
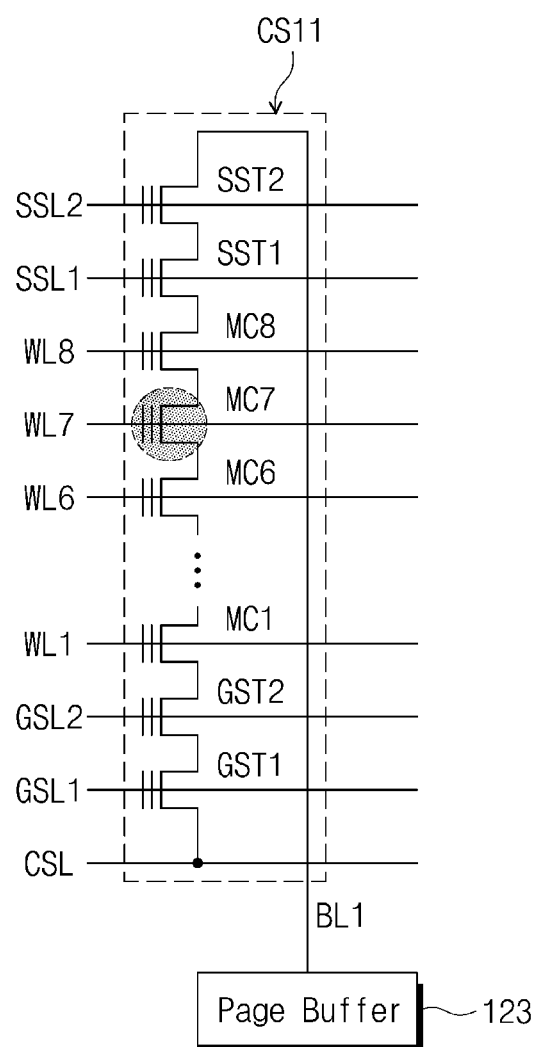
FIG. 9 exemplarily illustrates a first cell string in the memory block of FIG. 4.

Meanwhile, since the afore-described secure erase operation includes a reprogramming operation that is performed for each page, undesirable interference caused by the reprogramming operation may occur. An example of the interference is illustrated in FIGS. 8 and 9. FIG. 8 is a threshold voltage distribution diagram for illustrating an interference phenomenon, which may occur in a secure erase operation. FIG. 9 exemplarily illustrates the first cell string CS11 of the memory block shown in FIG. 4. In the graph of FIG. 8, the horizontal axis illustrates threshold voltage and the vertical axis illustrates the number of memory cells.

Referring to FIGS. 8 and 9, it will be assumed that the secure erase operation is executed on memory cells connected to a seventh word line WL7. Furthermore, it will be assumed that memory cells connected to sixth and eighth word lines WL6 and WL8 store valid data. Here, a voltage applied to the seventh word line WL7 may lead to a change in voltage distribution of memory cells connected to the sixth and eighth word lines WL6 and WL8. That is, unwanted electric charges may enter the memory cells connected to the sixth and eighth word lines WL6 and WL8, and this may lead to a change (e.g., charge gain) in voltage distribution of memory cells adjacent to a memory cell, on which the secure erase operation is executed, as shown in FIG. 8. The embodiments of FIG. 10 to be described below provide a solution for this.

Figure 10:
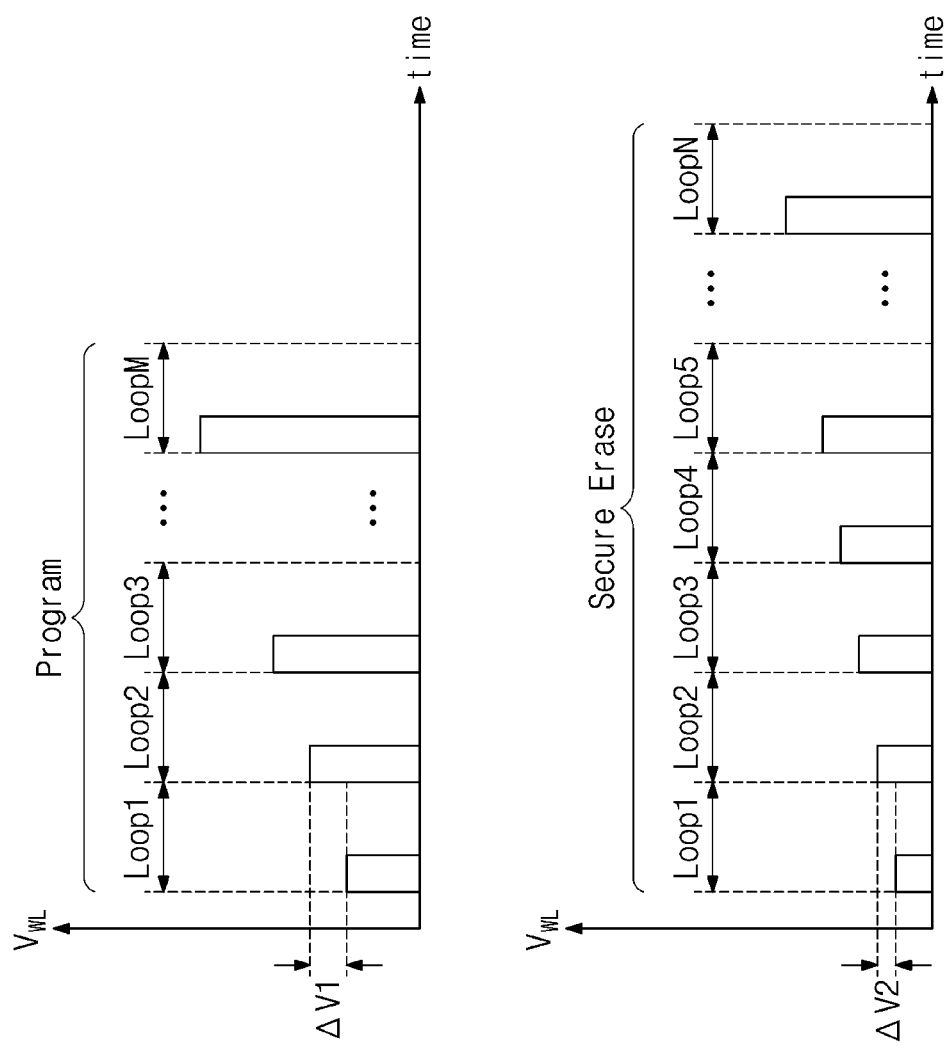
FIG. 10 illustrates program voltages in a typical programming operation and reprogram voltages in a secure erase operation according to example embodiments of the present disclosure.

FIG. 10 illustrates program voltages in a typical programming operation and reprogram voltages in a secure erase operation according to example embodiments of the present disclosure.

The upper graph in FIG. 10 show voltage pulses that are applied to a memory cell in the ISPP manner in a programming operation. During M program loops in the programming operation, voltage pulses increasing by a first voltage increment $\Delta V1$ may be sequentially applied to the memory cell. However, verification voltages for verification operations performed in respective program loops are omitted for simplicity of illustration. If the number of the program loops is too small or the voltage increment is too large, the inter-cell interference described with reference to FIGS. 8 and 9 may occur.

In contrast, the lower graph in FIG. 10 shows voltage pulses that are applied to a memory cell in the ISPP manner in the secure erase operation. During N program loops, voltage pulses increasing by a second voltage increment $\Delta V2$ may be sequentially applied to the memory cell. For example, the number N may be larger than the number M, and the second voltage increment $\Delta V2$ may be less than the first voltage increment $\Delta V1$. In other words, to minimize the inter-cell interference, a magnitude of a voltage pulse applied in each program loop may be gradually increased, and the total number of the program loops may be increased. In addition, a level of a voltage pulse in the last loop (i.e., N-th loop) of the secure erase operation may be lower than a level of a voltage pulse in the last loop (i.e., M-th loop) of a typical programming operation.

In example embodiments, the number N of the program loops and the increment $\Delta V2$ of the voltage pulses may be variously set for the secure erase operation. For example, in the secure erase operation, the number N of the program loops and the increment $\Delta V2$ of the voltage pulses may be determined in consideration of the number of program/erase (P/E) cycles of a memory block, on which the secure erase operation is performed, a program state to be reprogrammed, or the like. For example, the controller 110 of FIG. 1 or the invalid block manager 112 of FIG. 1 may refer to a table value for the number of P/E cycles, stored in a vendor region of the non-volatile memory device.

Figure 11:
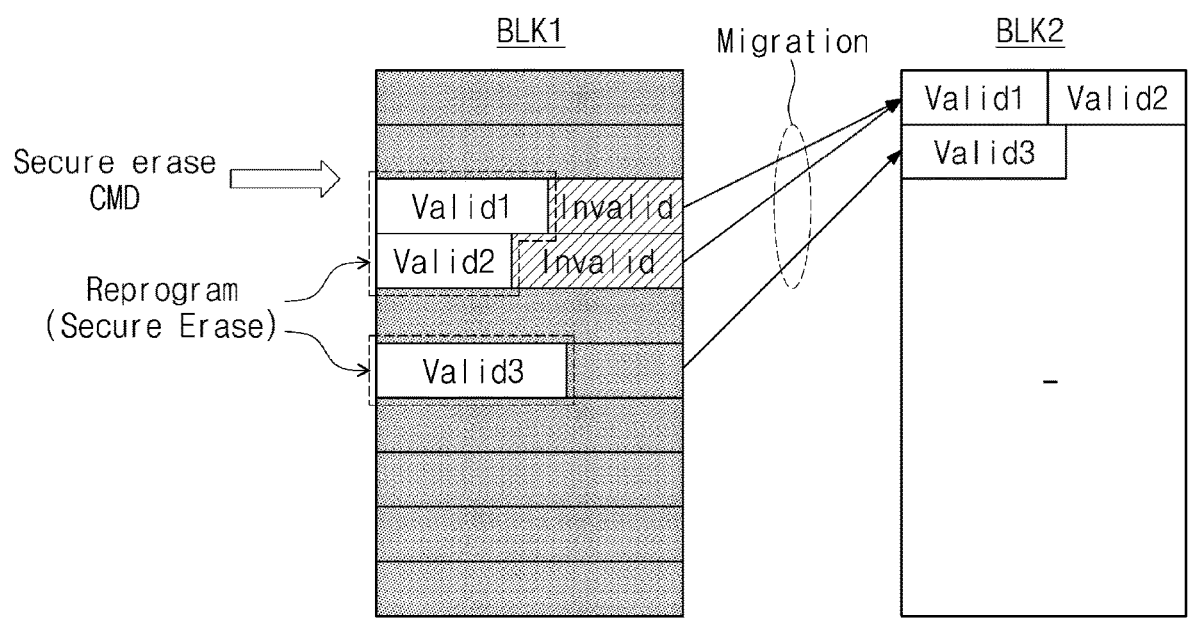
FIG. 11 conceptually illustrates a secure erase operation according to example embodiments of the present disclosure.

FIG. 11 conceptually illustrates a secure erase operation according to example embodiments of the present disclosure. The first memory block BLK1 may include a first page including valid data "Valid1" and invalid data "Invalid". The first memory block BLK1 may include a second page including valid data "Valid2" and invalid data "Invalid". Furthermore, the first memory block BLK1 may include a third page including valid data "Valid3".

The valid data Valid1-Valid3 of the first to third pages may be migrated or copied to a second memory block BLK2. For example, the migration or copy of the valid data Valid1-Valid3 may result from the garbage collection operation, the read reclaim operation, or the like, but the disclosure is not limited thereto.

After the migration or copy of the valid data Valid1-Valid3 is finished, the secure erase command may be executed. As the secure erase command is executed, the valid data Valid1-Valid3 of the first memory block BLK1 may be reprogrammed. For example, invalid data may be programmed to one of program states, which are higher than a program state corresponding to the invalid data. Alternatively, invalid data may be programmed to have a threshold voltage between two adjacent program states, which are higher than a program state corresponding to the invalid data.

In example embodiments, if the invalid data of the first to third pages are produced by the execution of the secure erase operation according to the present disclosure (in other words, if the invalid data are invalid data reprogrammed), the invalid data of the first to third pages may not be reprogrammed again. However, if the invalid data of the first to third pages are not data produced by the execution of the secure erase operation according to the present disclosure, the invalid data of the first to third pages may be reprogrammed.

Figure 12:
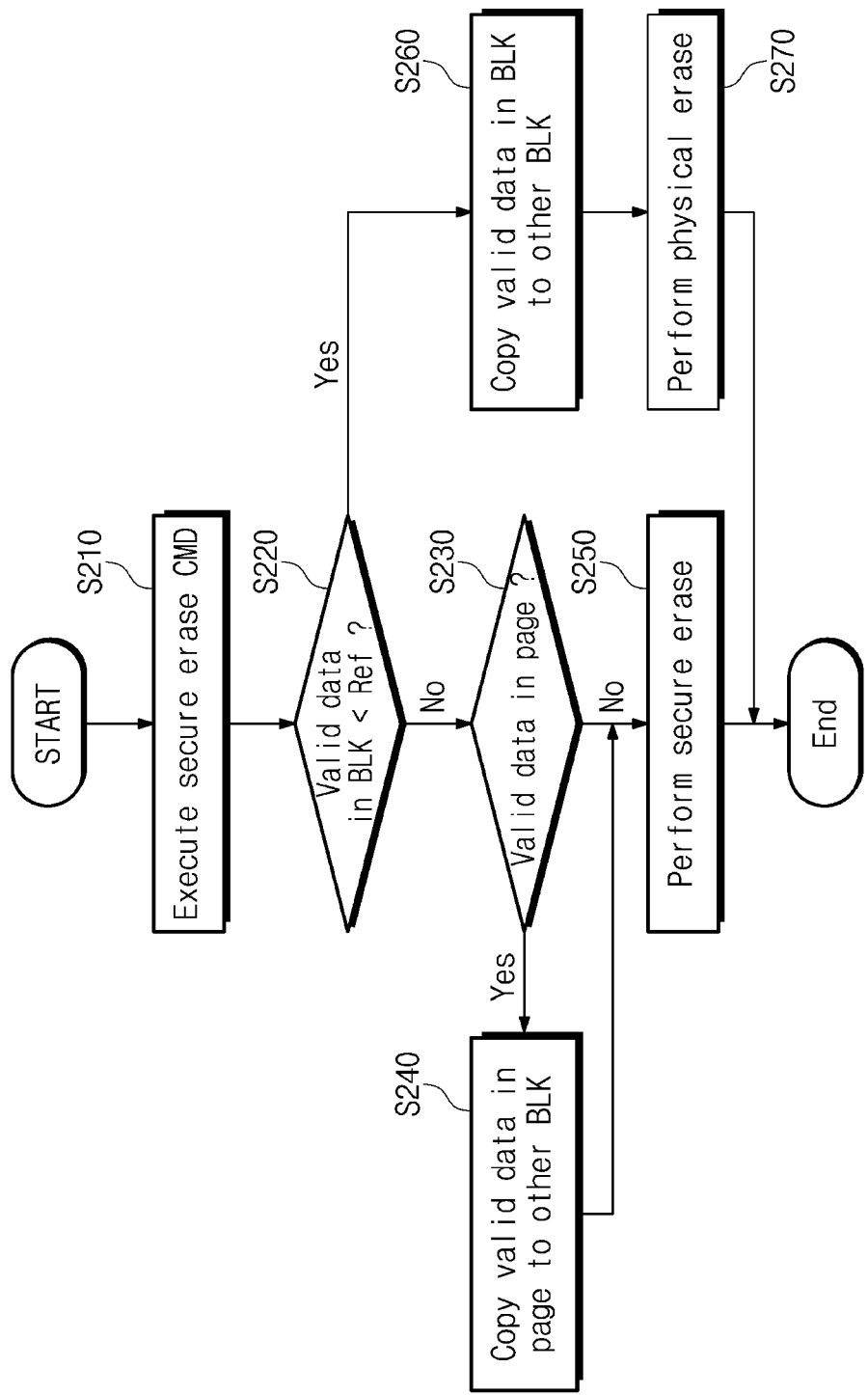
FIG. 12 illustrates a method of operating a storage device according to example embodiments of the present disclosure.

Meanwhile, if there is a relatively large amount of valid data in a memory block, it may be reasonable to migrate the valid data to another memory block and to reprogram valid data stored in an existing memory block. In contrast, if an amount of valid data in a memory block is relatively small, an influence on a life span of a non-volatile memory device may be reduced, even when the valid data is migrated and the valid data stored in the existing memory block is physically erased. FIG. 12 illustrates an example method for handling this case.

FIG. 12 illustrates a method of operating a storage device according to example embodiments of the present disclosure. To provide better understanding of example embodiments of the disclosure, FIG. 11 is referred along with FIG. 12.

In operation S210, a secure erase command may be executed. For example, in the case where invalid data is produced by the garbage collection operation, the read reclaim operation, or the like, the secure erase command may be executed to manage a memory block including the invalid data. For example, the secure erase command may be a command that is accompanied in the garbage collection operation, the read reclaim operation, or the like, but the disclosure is not limited thereto.

As an example, the secure erase command may be generated and/or executed according to the detection of the invalid data. For example, the invalid block manager 112 of FIG. 1 may detect invalid data stored in the non-volatile memory device, even if the invalid data is not produced by the garbage collection operation or the read reclaim operation described above. For example, the invalid block manager may execute a secure erase operation by a user's request or based on characteristics of the invalid data.

In operation S220, it may be determined whether a ratio of valid data in a memory block is less than a reference value. A table, which is associated with valid and invalid data in each memory block and is managed by a flash translation layer, may be used for this determination. If the ratio of the valid data in the memory block is higher than a reference value (e.g., No in S220), an operation S230 may be executed. In example embodiments, a reference value, which is used as a criterion for the determination, may be variously set in consideration of P/E cycles of the memory block.

In operation S230, it may be determined whether there is valid data in a page, on which the secure erase operation is to be performed. If there is the valid data in the page, on which the secure erase operation is to be performed (e.g., Yes in S230), an operation S240 may be executed to copy or migrate the valid data in the page to another memory block.

In operation S240, the valid data in the page, on which the secure erase operation is to be performed, may be copied or migrated to another memory block. After the copy or migration, the secure erase operation S250 may be executed on the valid data, which have been stored in an existing memory block. In other words, the valid data, which have been stored in the existing memory block, may be reprogrammed to one of higher program states. Alternatively, the valid data, which have been stored in the existing memory block, may be reprogrammed to have a threshold voltage between two higher program states.

In contrast, if there is no valid data in a page, on which the secure erase operation is to be performed (e.g., No in S230), an operation S250 may be immediately executed, because there is no valid data to be copied or migrated.

Meanwhile, in the case where, in operation S220, the ratio of the valid data in the memory block is less than the reference value (e.g., Yes in S220), an operation S260 may be executed to copy or migrate the valid data in the page to another memory block.

In operation S270, a physical erase operation may be executed on the existing memory block. The fact that the ratio of the valid data in the memory block is less than the reference value may mean that an amount of data to be physically erased is small and the physical erase operation on a relatively small amount of data has a small influence on the life span of the non-volatile memory device. Thus, in this case, the physical erase operation may be executed on the valid data stored in an existing block.

According to the afore-described operation method, the secure erase operation and the physical erase operation may be appropriately executed depending on the ratio of the valid data in the memory block. Thus, it may be possible to prevent the life span of the non-volatile memory device from being reduced by frequent physical erase operations and to enhance the security of the non-volatile memory device.

Figure 13:
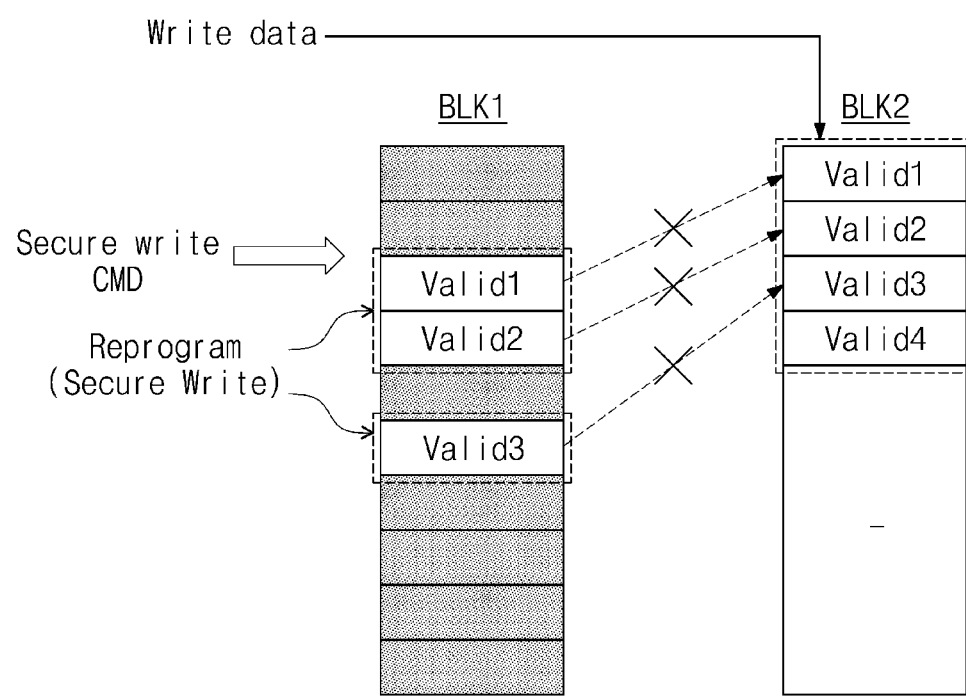
FIG. 13 conceptually illustrates a secure write operation according to example embodiments of the present disclosure.

FIG. 13 conceptually illustrates a secure write operation according to example embodiments of the present disclosure. In the case where new valid data including valid data stored in an existing block is programmed, the secure write operation may be executed. In a non-volatile memory device, an overwrite is not allowed, and thus, in the case where data stored in an existing block are updated, data to be updated may be stored in other block or in other page of the same block. In this case, a security issue associated with the valid data stored in the existing block may occur.

Referring further to FIG. 13, a first memory block may include a first page including the valid data Valid1, a second page including the valid data Valid2, and a third page including the valid data Valid3. In the case where the valid data stored in the first memory block BLK1 are updated, write data including the valid data Valid1-Valid4 may be stored in the second memory block BLK2. Here, the valid data Valid4 may represent updated data. The valid data Vaild1-Valid3 stored in the second memory block BLK2 may be the same data as the valid data stored in the first memory block BLK1. However, the valid data Vaild1-Valid3 stored in the second memory block BLK2 may not be originated from the first memory block BLK1.

The controller 110 of FIG. 1 may generate a secure write command when the write data are transferred to the non-volatile memory device 120 of FIG. 1. If the updating of storing the write data in the second memory block BLK2 is finished, the invalid block manager 112 of FIG. 1 or the flash translation layer may treat the valid data stored in the first memory block BLK1 as invalid data.

Furthermore, to prevent data from being leaked, the valid data stored in the first memory block BLK1 may be reprogrammed. The reprogramming may be performed using, for example, the programming method described with reference to FIGS. 6, 7, and 10. For example, the valid data stored in the first memory block BLK1 may be reprogrammed to one of higher program states. Alternatively, the valid data stored in the first memory block BLK1 may be reprogrammed to have a threshold voltage between two higher program states.

In the present embodiments, the write data associated with the updating are illustrated to be stored in the second memory block BLK2. However, in other embodiments, the write data associated with the updating may be stored in the memory block (i.e., BLK1), in which the existing valid data are stored.

Figure 14:
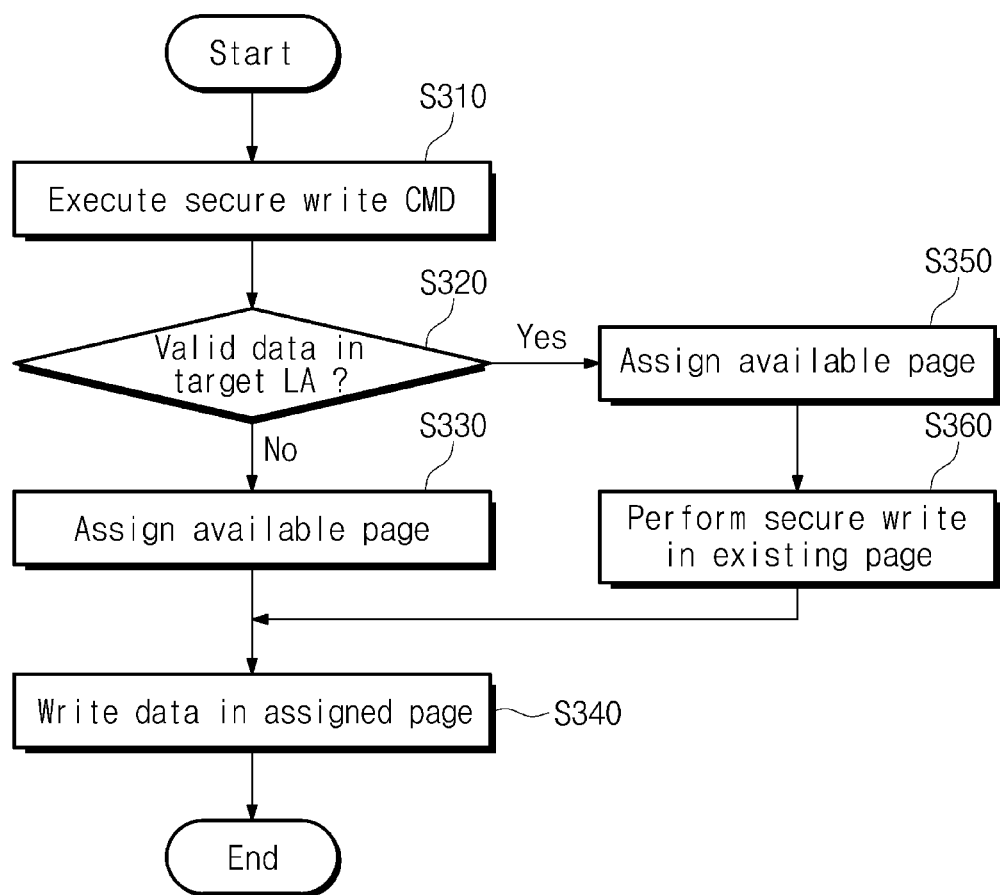
FIG. 14 illustrates a method of operating a storage device according to example embodiments of the present disclosure.

FIG. 14 illustrates a method of operating a storage device according to example embodiments of the present disclosure. To provide a better understanding of example embodiments of the disclosure, FIG. 13 is referred to along with FIG. 14.

In operation S310, a secure write command may be executed. For example, in the case where valid data stored in the first memory block BLK1 is updated, a secure write command for reprogramming the existing valid data stored in the first memory block BLK1 may be generated and executed. Alternatively, an operation of reprogramming the existing valid data stored in the first memory block BLK1 may be executed along with a data write on the second memory block BLK2, without a separate write secure command.

In operation S320, it may be determined whether there is valid data in a target logical address LA. If there is no valid data in the target logical address (e.g., No in S320), operations S330 and S340 may be sequentially executed to perform a normal (or general) write operation.

In operation S330, an available page (i.e., a physical address) corresponding to the target logical address may be assigned. In this case, since valid data is not stored in a page corresponding to the target logical address, the page corresponding to the target logical address may be assigned as the available page. Thereafter, in operation S340, data may be written in the assigned page.

In contrast, in the case where there is valid data in the target logical address (i.e., Yes in S320), an operation S350 may be executed to assign an available page. Here, the available page may be a page in another memory block different from that of an existing page or in another page in the same block.

In operation S360, a secure write operation may be executed on the existing page. Since new data (e.g., data to be updated) are stored in the newly assigned page, the invalid block manager 112 of FIG. 1 or the flash translation layer may process the data stored in the existing page as invalid data. The invalid data may be programmed to one of states higher than a program state corresponding to the invalid data or may be programmed to have a threshold voltage between two adjacent program states. Then, data may be written in the allocated page (in S340).

Figure 15:
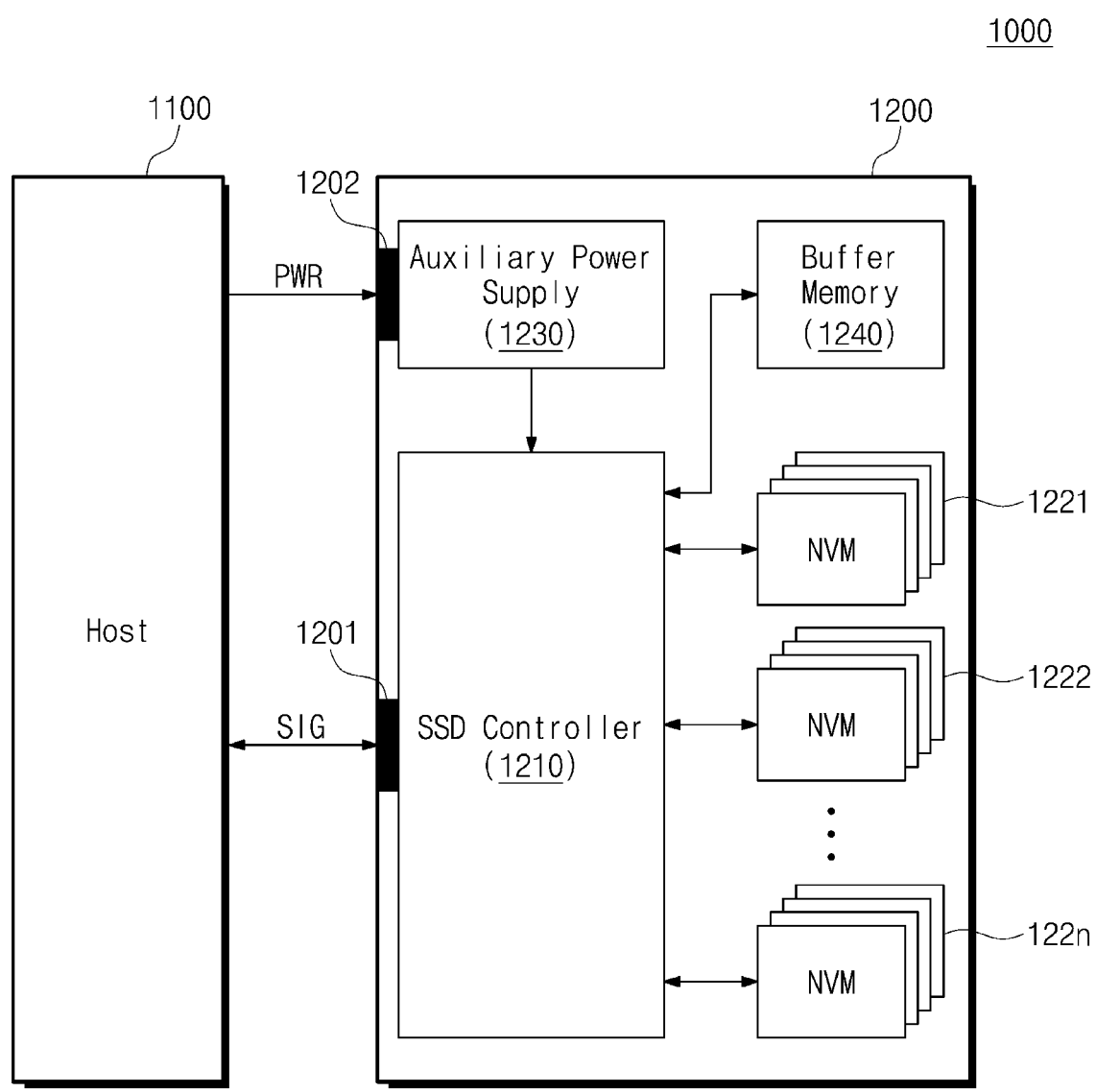
FIG. 15 is a block diagram illustrating a solid state drive (SSD) system, to which the secure erase operation and/or the secure write operation in the present disclosure are applied.

FIG. 15 is a block diagram illustrating a solid state drive (SSD) system 1000, to which the secure erase operation and/or the secure write operation in the present disclosure are applied. Referring to FIG. 15, the SSD system 1000 may include a host 1100 and an SSD 1200.

The SSD 1200 may transmit and receive a signal SIG to and from the host 1100 through a signal connector 1201 and may be provided with power PWR through a power connector 1202. The SSD 1200 may include an SSD controller 1210, a plurality of flash memories 1221-122n, an auxiliary power supply 1230, and a buffer memory 1240.

The SSD controller 1210 may control the flash memories 1221-122n in response to the signal SIG received from the host 1100. For example, the SSD controller 1210 may execute the secure erase operation and the secure read operation, based on the examples described with reference to FIGS. 1 to 14.

The plurality of flash memories 1221-122n may operate under control of the SSD controller 1210. The auxiliary power supply 1230 may be connected to the host 1100 through a power connector 1202. The auxiliary power supply 1230 may be charged by the power PWR supplied from the host 1100. In the case where there is difficulty associated with the supply of the power PWR from the host 1100, the auxiliary power supply 1230 may be used as a power supply of the SSD 1200.

According to some embodiments of the disclosure, a secure erase operation, instead of a physical erase operation, is performed on invalid data stored in a non-volatile memory device. Accordingly, security of a storage device may be improved, and a life span of the storage device may be prevented from being reduced by frequent physical erase operations.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments of the disclosures have been particularly shown and described, it will be understood by one of ordinary skill in the art that variations in form and detail may be made therein without departing from the spirit and scope of the attached claims.

What is claimed is:

1. A method of operating a controller controlling a non-volatile memory device including a first memory block and a second memory block, the method comprising:
    detecting an amount of invalid data of the first memory block;
    determining whether the amount of the invalid data is less than a reference value; and
    in response to the amount of invalid data being less than the reference value, executing a secure erase operation to change a voltage distribution of the invalid data, wherein:
    the secure erase operation comprises reprogramming a first program state of the invalid data to an intermediate program state between second and third program states adjacent to each other, and
    the second and third program states are program states higher than the first program state.

2. The method of claim 1, wherein the intermediate program state has a threshold voltage distribution that is higher than an upper limit of the second program state and is lower than a lower limit of the third program state.

3. The method of claim 1, further comprising determining whether there is valid data in a page including the invalid data, based on the affirmative result of the determination.

4. The method of claim 3, wherein a physical erase is executed on the first memory block, when the amount of the invalid data is greater than the reference value.

5. The method of claim 4, further comprising determining whether there is valid data in the page, when the amount of the invalid data is less than the reference value.

6. The method of claim 5, wherein:
when there is the valid data in the page, the valid data is copied to the second memory block, and
when the valid data is absent in the page, the secure erase operation is executed on the invalid data.

7. The method of claim 4, wherein, when the amount of the invalid data is greater than the reference value, the valid data is copied to the second memory block in advance before executing the physical erase on the first memory block.

8. The method of claim 1, wherein the reprogramming is executed according to an incremental step pulse programming (ISPP) manner.

9. The method of claim 8, wherein:
a number of program loops in the reprogramming is larger than a number of program loops in a programming operation on the non-volatile memory device, and
each of increments of program pulses in the reprogramming is smaller than increments of program pulses in the programming operation on the non-volatile memory device.

10. The method of claim 1, further comprising maintaining the intermediate program state until the amount of the invalid data within the first memory block becomes greater than the reference value.

11. A method of operating a controller controlling a non-volatile memory device including a first memory block and a second memory block, the method comprising:
detecting an amount of invalid data of the first memory block;
determining whether the amount of the invalid data is less than a reference value; and
executing a secure erase operation to change a voltage distribution of the invalid data, based on a result of the determination, wherein:
the secure erase operation is executed on the invalid data, when the amount of the invalid data is less than the reference value, and
a physical erase is executed on the first memory block, when the amount of the invalid data is greater than the reference value.

12. The method of claim 11, wherein:
the secure erase operation comprises reprogramming a first program state of the invalid data to an intermediate program state between second and third program states adjacent to each other, and
the second and third program states are program states higher than the first program state.

13. The method of claim 12, wherein the reprogramming is executed according to an incremental step pulse programming (ISPP) manner.

14. The method of claim 13, wherein:
a number of program loops in the reprogramming is larger than a number of program loops in a programming operation on the non-volatile memory device, and
each of increments of program pulses in the reprogramming is smaller than increments of program pulses in the programming operation on the non-volatile memory device.

15. The method of claim 12, wherein the intermediate program state has a threshold voltage distribution that is higher than an upper limit of the second program state and is lower than a lower limit of the third program state.

16. The method of claim 12, further comprising maintaining the intermediate program state until the amount of the invalid data within the first memory block becomes greater than the reference value.

17. The method of claim 11, further comprising determining whether there is valid data in a page including the invalid data, when the amount of the invalid data is less than the reference value.

18. The method of claim 17, wherein:
when there is the valid data in the page, the valid data is copied to the second memory block, and
when the valid data is absent in the page, the secure erase operation is executed on the invalid data.

19. The method of claim 11, wherein when the amount of the invalid data is greater than the reference value, valid data within the first memory block is copied to the second memory block in advance before executing the physical erase on the first memory block.

20. A method of operating a controller controlling a non-volatile memory device, the method comprising:
detecting an amount of invalid data of a memory block of the non-volatile memory device; and
executing a secure erase operation to change a voltage distribution of the invalid data, when the amount of the invalid data is less than a reference value, wherein:
the secure erase operation comprises reprogramming a first program state of the invalid data to an intermediate program state between second and third program states adjacent to each other, and
the second and third program states are program states higher than the first program state.

* * * * *